United States Patent
Ryan et al.

(10) Patent No.: US 7,319,327 B2
(45) Date of Patent: Jan. 15, 2008

(54) MAGNETIC RESONANCE IMAGING SYSTEM WITH REDUCED COOLING NEEDS

(75) Inventors: David Thomas Ryan, deceased, late of Harogate (GB); by J. Anne Ryan, legal representative, Harogate (GB); Evangelos Trifon Laskaris, Schenectady, NY (US); Kathleen Melanie Amm, Clifton Park, NY (US); Bruce Alan Knudsen, Amsterdam, NY (US); Judson Sloan Marte, Wynantskill, NY (US); Thomas Robert Raber, Schenectady, NY (US); Robert John Zabala, Schenectady, NY (US); James William Bray, Niskayuna, NY (US); Bruce Campbell Amm, Clifton Park, NY (US); Sergio Paulo Martins Loureiro, Saratoga Springs, NY (US)

(73) Assignee: General Electric Company, Niskayuna, NY (US)

( * ) Notice: Subject to any disclaimer, the term of this patent is extended or adjusted under 35 U.S.C. 154(b) by 31 days.

(21) Appl. No.: 11/282,074

(22) Filed: Nov. 17, 2005

(65) Prior Publication Data
US 2007/0108979 A1 May 17, 2007

(51) Int. Cl.
*G01V 3/00* (2006.01)
(52) U.S. Cl. ...................................... 324/318
(58) Field of Classification Search ................. 324/318
See application file for complete search history.

(56) References Cited

U.S. PATENT DOCUMENTS

| | | | |
|---|---|---|---|
| 5,250,901 A * | 10/1993 | Kaufman et al. | 324/318 |
| 5,596,303 A * | 1/1997 | Akgun et al. | 335/216 |
| 6,783,059 B2 | 8/2004 | Laskaris et al. | |
| 2005/0028347 A1* | 2/2005 | Maher | 29/592.1 |
| 2005/0062473 A1* | 3/2005 | Ryan et al. | 324/318 |

* cited by examiner

*Primary Examiner*—Diego Gutierrez
*Assistant Examiner*—Megann E Vaughn
(74) *Attorney, Agent, or Firm*—Jean K. Testa; Curtis B. Brueske

(57) ABSTRACT

A Magnetic Resonance Imaging (MRI) system having a vacuum vessel positioned about an imaging volume, one or more high temperature superconducting coils positioned within the vacuum vessel, and a cryocooler coupled to the vacuum vessel to operate the superconducting coil at a temperature above 10 K. At least one gradient coil is positioned between an imaging volume and the superconducting coil without any thermal shielding interposed between the gradient coil and the superconducting coil. A method of forming an MRI system includes forming at least one winding of the main field generating coils with high temperature superconducting material, positioning the winding in a vessel for receiving cryogenic fluid, and positioning a gradient coil between the imaging volume and the winding without placing a thermal radiation shield between the gradient coil and the winding.

17 Claims, 2 Drawing Sheets

MAGNETIC RESONANCE IMAGING SYSTEM WITH REDUCED COOLING NEEDS

FIELD OF THE INVENTION

This invention relates generally to magnetic resonance imaging (MRI) systems and, more specifically, to MRI systems incorporating high-temperature superconducting magnetic coils and methods of assembling and operating such systems.

BACKGROUND OF THE INVENTION

MRI systems are widely used for medical diagnosis. They provide high image resolution in advanced applications such as cardiac studies and neuro-scanning. The systems are unique in being able to provide detailed images of soft tissue when bone or other tissue may otherwise obstruct the view.

MRI systems have undergone continual advancement since their inception in the 1970s. Partly through development of larger and more powerful magnets, substantial improvements in image quality have been realized. However, use of these magnets tends to increase the size and cost of MRI systems.

As a premier medical imaging and diagnostic tool, cost is a significant impediment to wider deployment of MRI systems throughout the world. Other factors limiting greater commercialization of these systems include requirements for a large, stable power supply, and size and weight.

For many medical applications MRI systems should provide magnetic field strengths ranging from 0.3 Tesla up to at least 3 Tesla, although even larger field strengths (e.g., up to 20 Tesla or more) may be used in research. Magnetic fields of such intensity are generally formed with large superconducting magnetic coils (traditionally Low Temperature Superconductor (LTS) coils). To operate the magnet in a superconducting mode, the Low Temperature Superconductor (LTS) coils must operate in the vicinity of 4.5 K, i.e., a temperature below the critical temperature of the coil material. This generally requires enclosure of the LTS coils within a vessel cooled with liquid helium.

Although superconducting MRI systems are smaller and more efficient than magnets that operate with coils formed of resistive wire, they remain large and bulky in the absolute sense. Thus, it continues to be a desire in the art to reduce the mass and volume of MRI systems while not sacrificing the strength and efficiency of the magnets.

In addition to providing a main, relatively uniform and stable magnetic field across an imaging volume, the MRI system may include a set of low power gradient magnets ranging in field strength from 18 to 27 millitesla. The coils of the gradient magnets are cooperatively pulsed to provide local variations in the field strength. This enables selection of views within portions of the image volume.

When me gradient coils are electrically pulsed, the resulting time changing magnetic flux induces eddy currents within conductive components positioned about the imaging volume. These, in turn, produce secondary magnetic fields that can degrade the quality and effectiveness of the field set up by the gradient coils and the main magnet. To partially compensate for this effect, a set of shield gradient coils may be pulsed to set up fields which counter those portions of the gradient coil field that extend into the helium-cooled vessel. Although the shield gradient coils can effectively cancel a portion of the field generated by the gradient coils, there remains a need to further suppress the resulting eddy currents.

The shield gradient components and other shield components, e.g., thermal radiation shields, add cost and weight to MRI systems by increasing the diameter of the magnet main coils. Yet it is generally desirable to provide lower-cost, easily deployable MRI systems without sacrificing image quality. For MRI systems to have broader application in medical diagnostics, the size, weight and cost associated with operating the system should be further reduced.

The invention provides a Magnetic Resonance Imaging (MRI) system having a vacuum vessel positioned about an imaging volume, one or more high temperature superconducting coils positioned within the vacuum vessel, and a cryocooler coupled to the vacuum vessel to operate the superconducting coil at a temperature above 10 K. At least one gradient coil is positioned between an imaging volume and the superconducting coil without any thermal shielding interposed between the gradient coil and the superconducting coil.

The invention also provides a method of forming an MRI system including forming at least one winding of the main field generating coils with high temperature superconducting material, positioning the winding in a vessel for receiving cryogenic fluid, and positioning a gradient coil between the imaging volume and the winding without placing a thermal radiation shield between the gradient coil and the winding.

BRIEF DESCRIPTION OF THE DRAWINGS

The above and other aspects of the invention will become more apparent in light of the following detailed description when read in conjunction with the accompanying drawings, wherein.

Wherever appropriate, like reference numbers are used throughout the figures to refer to like parts.

DETAILED DESCRIPTION OF THE INVENTION

In this disclosure reference is made to High Temperature Superconductors, the class of materials experiencing a superconductive state at temperatures above 20 K. Conventionally, the critical temperature of a superconductor refers to the temperature at which the superconducting material loses the superconductive state. However, for purposes of this disclosure, the term critical temperature, $T_c$, when used with reference to High Temperature Superconductor materials, is the temperature above which the magnetic coil formed therewith can no longer operate at its rated magnetic field. The rated magnetic field may be specified for a particular design and is generally a function of parameters such as magnet size, shape and operating temperature.

Figure 1:
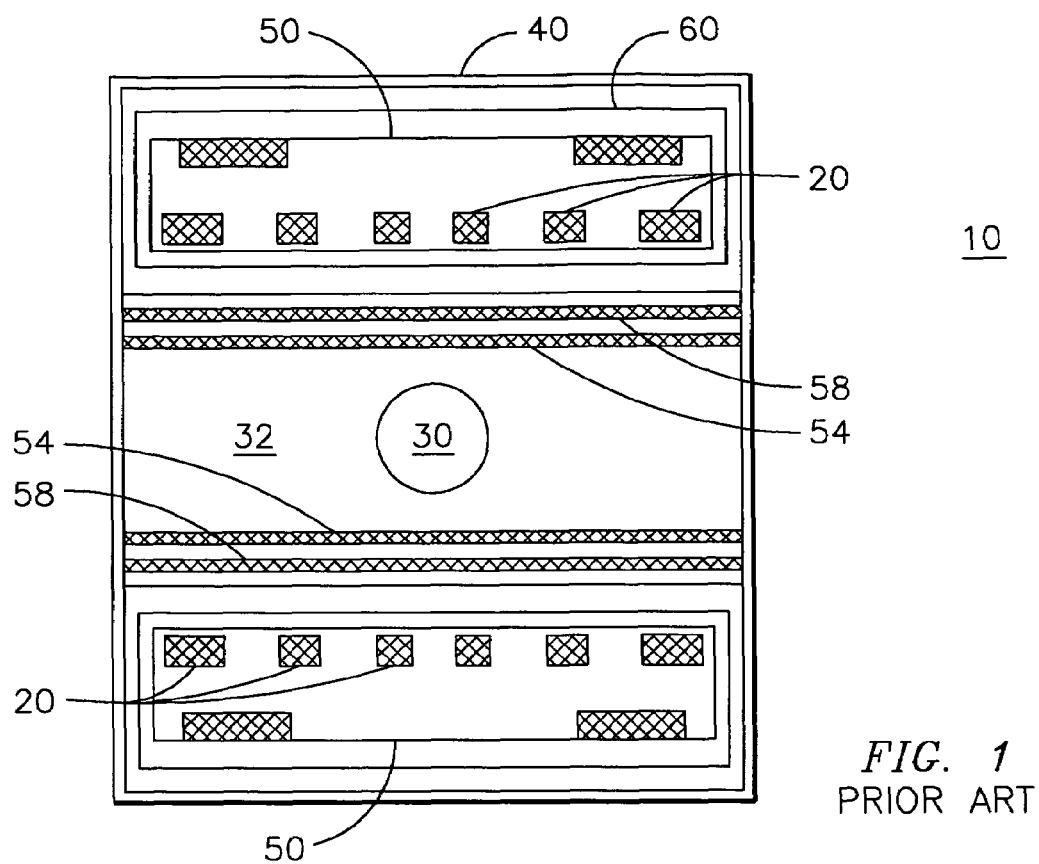
FIG. 1 illustrates, in cross section, a partial view of a conventional MRI device.

With reference to FIG. 1 them is shown, in partial view, a typical, known MRI device 10 employing Low Temperature Superconductor (LTS) windings 20 for generating a homogeneous magnetic field in an imaging volume 30 within the magnet bore 32. The terms winding and coil are used interchangeably throughout this disclosure unless otherwise indicated. A vacuum vessel 40 provides a pressure tight enclosure. The windings 20 operate within a cryogenic, helium-cooled vessel 50 inside the vacuum vessel 40. With liquid helium flowing from a cryocooler (not shown) and into the vessel 50, the LTS coils 20 are cooled to about 4.5 K in order to operate in a superconducting state. Each of the vessels 40 and 50 may be a welded aluminum structure.

Low power gradient magnet coils 54 are positioned within the bore 32 to modulate the field within the image volume 30. A set of shield gradient coils 58 may also be positioned within the magnet bore 32, between the gradient coils 54 and other components within the vacuum vessel 40 to reduce resulting eddy currents.

A thermal shield 60, such as made of welded aluminum, is positioned within the vacuum vessel 40, surrounding the helium vessel 50, receive radiation emitted by any of the LTS coils 20 or the gradient magnet coils 54 or the shield gradient coils 58. Generally, shields of this type are made of a thermally conductive, and electrically conductive, material. As used in this disclosure, the term thermal shield means a metallic containing member positioned within the vacuum vessel housing a superconductive main field coil in an MRI system.

As discussed above, even with optimal operation of the shield gradient coils 58, when the gradient magnet coils 54 are electrically pulsed, the resulting time changing magnetic flux sets up undesirable eddy currents in various components. Formation of such eddy currents in the thermal shield 60 creates undesirable fields as well as thermal loading on the helium vessel 50, which is cryogenically cooled at considerable expense. For example, after the vessel 50 reaches a stable temperature near 4.5 K, steady state operation requires approximately 1000 watts of power to remove each watt of heat generated within the helium vessel.

Figure 2:
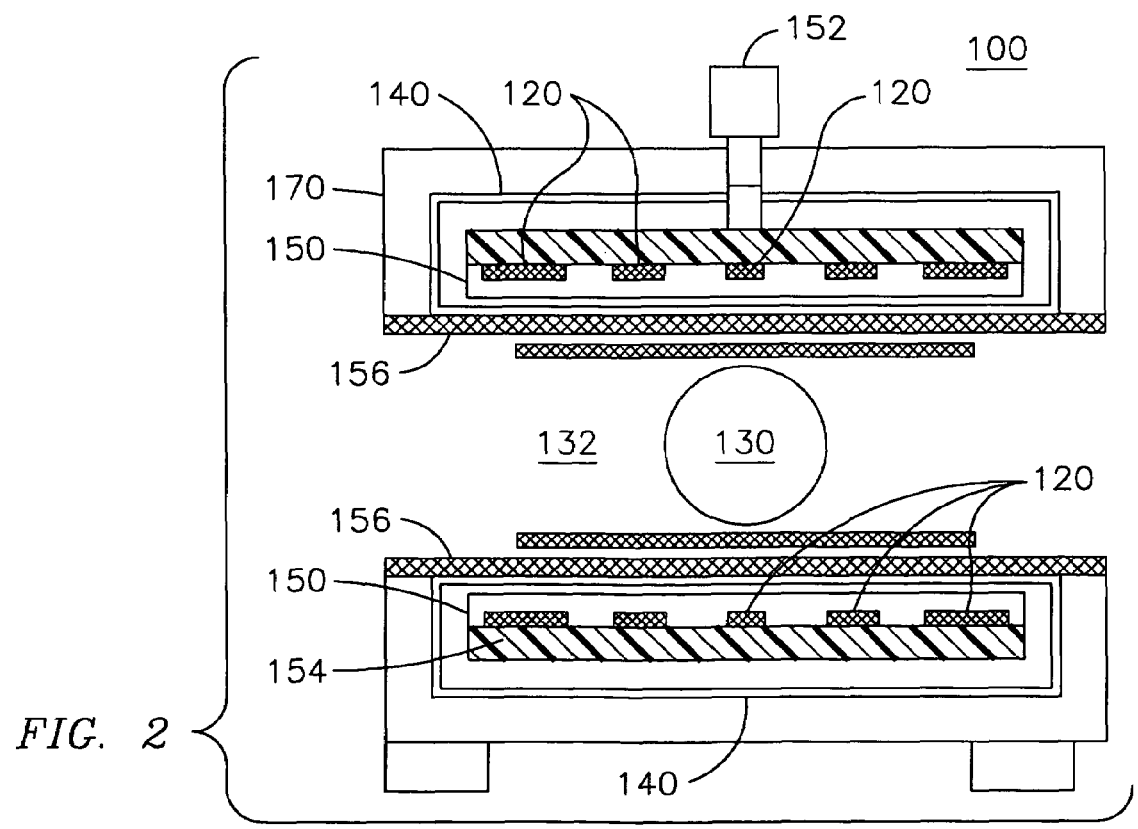
FIG. 2 provides, in cross section, a view of an exemplary MRI device according to aspects of the invention.
Figure 3:
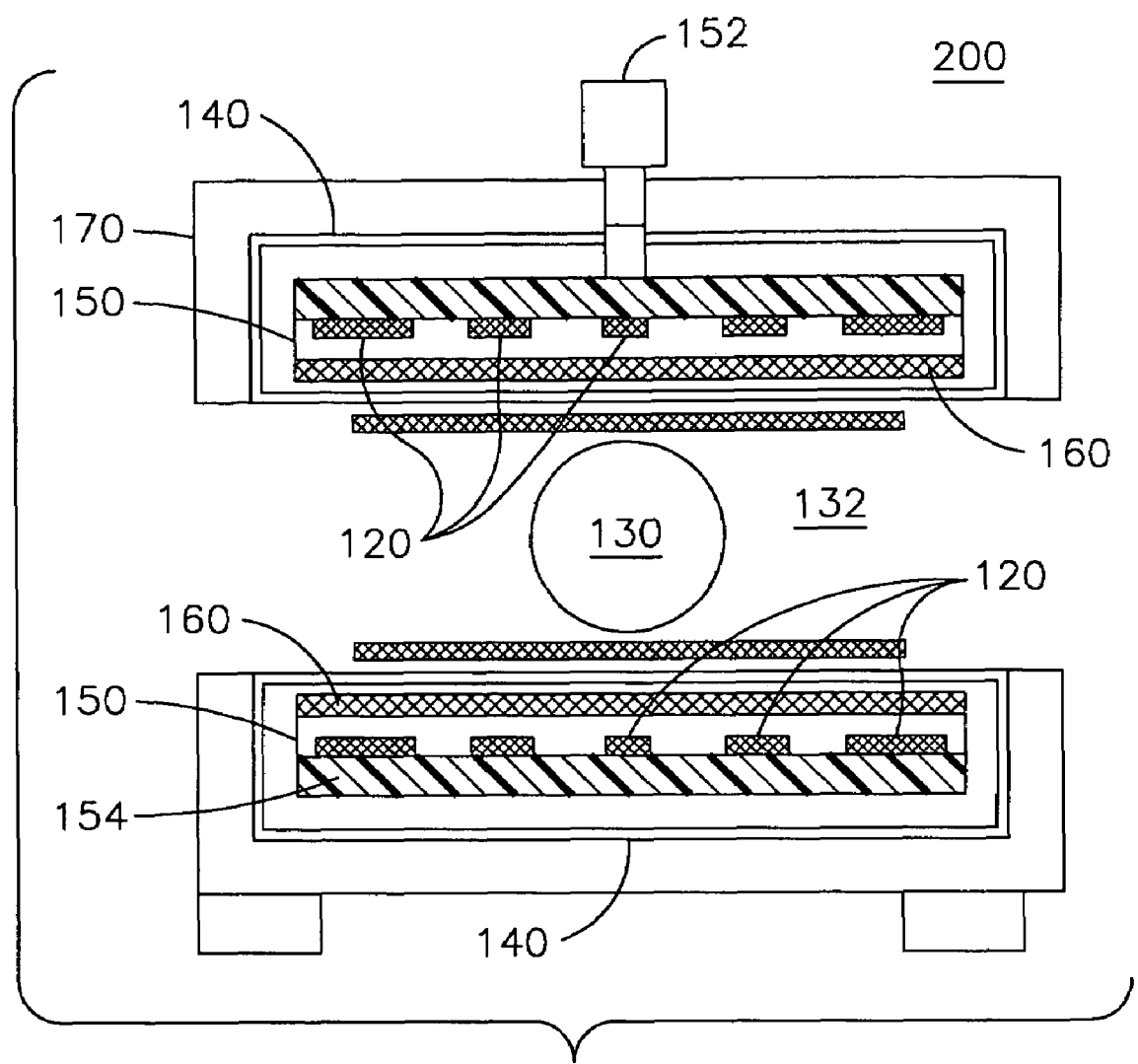
FIG. 3 is a cross sectional view of another exemplary MRI device embodying features of the invention.

Reference is now made to embodiments of the present invention as illustrated in FIGS. 2 and 3 wherein an MRI device is provided without having a thermal shield positioned in the vacuum vessel, As further described below, this allows reduction in the size and weight of the system and enables an increase in diameter of the inner bore 32 where the patient is received. In addition, there is no need to compensate for secondary magnetic fields that would otherwise result from eddy currents formed in such a thermal shield.

One such MRI system 100 is shown in the partial schematic diagram of FIG. 2. According to this embodiment, windings 120, formed of High Temperature Superconductor (HTS) material, are configured to generate a homogeneous magnetic field in an imaging volume 130 within a magnet bore 132. A vacuum vessel 140, such as formed with a fiberglass-reinforced polymer (FRP) with a thin metal liner, provides a vacuum tight enclosure suitable for containing the superconducting windings 120 whereby gradient induced eddy currents are significantly reduced. The windings 120 may be conduction cooled by a heat station 150 inside the vacuum vessel 140. With a single stage cryocooler 152 thermally connected to heat station 150, the coils 120 operate, for example, at 20 K, well below the associated critical temperature $T_c$. The coils 120 are capable of sustaining a critical current density of at least 100 Amps per square cm at a temperature of 20 K.

To facilitate thermal stabilization within heat station 150, thermal reservoir material 154 may be included within heat station 150. In one exemplary embodiment, the thermal reservoir material has a thermal storage capacity of at least about 2.2 kJ/kg at 20 K. Portions of the coils 120 are in thermal contact with the reservoir material 154. For further details relating to selection and insertion of thermal reservoir material 154 see U.S. Patent Application Pub. No. US 2005/0062473 incorporated herein by reference. By way of example, the reservoir material 154 may comprise epoxy, methacrylate, polyurethane, rubber, plastic or lead.

Low power gradient magnet coils 156 are positioned outside the vacuum vessel 140 and within the bore 132 to modulate the field within the image volume 130. In this exemplary embodiment, the coils 156 are of the resistive, nonsuperconducting type. A set of shield gradient coils (not shown) may be positioned between the gradient coils 156 and the vacuum vessel 140 to limit the amount of flux radiated from the gradient coils 156 and into the vessel 140. The HTS windings 120 may, by way of example, be formed of magnesium diboride ($MgB_2$) for which $T_c$=39 K. The $MgB_2$ may include chemical doping and/or additions, such as nano-particles of binary, ternary or complex oxides, borides, carbides, and/or nitrides with weight ratios of up to approximately 30%. Among these. SiC, can be added to optimize the critical current density $J_c$, which may exceed $2\times10^5$ $A/cm^2$ at 20 K under a 2 T field. Other examples of HTS materials may include, but are not limited to, DBCO (Dysprosium Barium Copper Oxide), YBCO (Yttrium Barium Copper Oxide), and BSCCO (Bismuth Strontium Calcium Copper Oxide). The 20 K operating temperature (in comparison to an operating temperature of 4.5 K) provides greater cooling capacity, which enables a cooler to more easily maintain the higher operating temperature, even in the absence of the thermal shield. Although the operating temperature could be as low as 10 K, a temperature of 20 K is suitable to maximize current density with $MgB_2$ windings, and a 30 K or higher temperature is sufficient for YBCO windings. Generally, 20 K is a suitable temperature for all HTS materials in order to obtain high superconductor current density at fields of 2-4 T. Operation at higher temperatures or with stronger fields may result in lower current densities.

With greater cooling capacity available at 20 K and higher temperatures, and no thermal shield positioned within the vacuum vessel 140, the dominant heat load on the magnet windings is from room temperature radiation, and this is independent of the magnet temperature.

By way of comparison, in conventional LTS magnets (4.5 K), the thermal shield runs at about 20-50 K and the heat load it receives matches the cooling capacity of the single stage cryocoolers that cool the shield. According to the aspects of the invention, HTS magnet windings 120 can operate in essentially this same temperature range without requiring a thermal shield. That is, with higher cooling power available (relative to, for example, the prior art MRI device 10 of FIG. 1 with LTS windings). Although the thermal shield normally surrounding a superconducting MRI magnet is not needed, a multilayer insulative material 170 may be applied inside the vacuum chamber 140 to reduce the radiation heat load on the winding structure 120.

Next, referring to FIG. 3, an MRI system 200, according to an alternate embodiment of the invention, also includes HTS windings 120 which generate a homogeneous magnetic field in an imaging volume 130 within a magnet bore 132. Fiberglass reinforced polymer vacuum vessel 140 provides a vacuum tight enclosure suitable for containing low temperature magnet windings. The windings 120 operate within a conduction cooled heat station 150 inside the vacuum vessel 140. A single stage cryocooler 152 is thermally attached to the heat station 150, and cools the windings 120, for example, to 20 K, well below the associated critical temperature $T_c$. As discussed with reference to FIG. 2, to facilitate thermal stabilization within the heat station 150, a thermal reservoir material 154 may be included within the heat station 150. Portions of the windings 120 are in thermal contact with the reservoir material 154. Also, as described for the embodiment of FIG. 2, the windings 120 may be formed of magnesium diboride ($MgB_2$). However, in lieu of the gradient magnet coils 156 (positioned outside the helium vessel 150 as shown in FIG. 2), low power gradient magnet coils 160, formed of HTS material such as $MgB_2$, are positioned inside the helium vessel 150 to modulate the field within the image volume 130. No thermal radiation shield is positioned within the vacuum vessel 140.

EXEMPLARY ADVANTAGES AND FEATURES OF THE INVENTION

Because of the higher cooling capacity available for HTS windings, relative to LTS windings, MRI devices embodying aspects of the present invention do not require a thermal shield surrounding the superconducting magnetic windings within the vacuum vessel. This avoids issues that could otherwise arise when eddy currents are induced in the thermal shield. It also enables a more compact magnet system or, in the alternative, enables an increased size for the gradient coils, or for the patient-receiving bore. With the greater heat capacity, the HTS windings are more stable with respect to thermal transients such as those caused by operation of gradient coils. This allows the use of partially shielded or completely unshielded gradient coils, thereby enabling stronger magnetic field gradients at a given level of input power. The elimination of eddy currents in a thermal shield also increases the strength of the field gradient that may be attained since such eddy currents partially cancel out the field gradients. It is possible to eliminate the thermal shield because the main windings are operating at a temperature greater than 20 K.

With regard to thermal transients, the thermal reservoir material 154 adds greater tolerance to the system by absorbing transient heat loads that result from power interruptions and transient eddy currents resulting from gradient coil operation. With the reservoir material, these transient heat loads result in smaller temperature fluctuations to assure that the magnet temperature stays within the defined operating range, for example 20-30 K.

Preferred embodiments have been set forth herein for the purpose of illustration, but disclosure of these embodiments does not limit the scope of the invention which is only bounded by the claims which follow. Accordingly, numerous modifications, adaptations and alternatives to the embodiments set forth herein will be apparent to those skilled in the art without departing from the scope of the claimed invention.

We claim:

1. A method of forming an MRI system having an associated imaging volume and main field generating coils of an MRI magnet that generate a magnetic field within the imaging volume, comprising:
    forming at least one winding of the main field generating coils with high temperature superconducting material;
    positioning the winding in a heat station for receiving cryogenic cooling in order to depress the winding temperature and place the winding material in a superconducting state when generating the main field; and
    positioning a gradient coil between the imaging volume and the winding without placing a thermal radiation shield structure between the gradient coil and the winding.

2. The method of claim 1 wherein the winding is capable of sustaining a critical current density of at least 100 Amps per square cm at a temperature of 20 K.

3. The method of claim 1 further comprising the step of forming the high temperature superconductor material with at least Magnesium and Boron.

4. The method of claim 3 wherein the step of forming the high temperature superconductor material further comprises adding nano-particles selected from the group consisting of binary, ternary or complex oxides, carbides, borides, and/or nitrides.

5. The method of claim 4 wherein the nano-particles comprise SiC.

6. The method of claim 3 wherein the high temperature superconductor material comprises $MgB_2$.

7. The method of claim 1 further comprising the step of forming a thermal reservoir within a portion of the heat station for receiving cryogenic fluid.

8. The method of claim 1 including the further step of positioning the heat station within a vacuum vessel, wherein the step of positioning the gradient coil includes placing the gradient coil interior to the vacuum vessel.

9. A method of operating a Magnetic Resonance Imaging (MRI) system having an imaging volume therein, a vacuum vessel positioned about the imaging volume, at least one superconducting main coil positioned within the vacuum vessel for generating a magnetic field within the imaging volume and at least one gradient coil for adjusting the magnetic field within the imaging volume, the method comprising:
    providing cryogenic cooling from a cooling device into a portion of the vacuum vessel containing the main coil to cool the main coil to a superconducting state a temperature at or lower than $T_c$ but higher than 20 K;
    energizing the main coil while in the superconducting state; and
    energizing the gradient coil in the absence of a thermal shield structure between the gradient coil and the main coil.

10. The method of claim 9 wherein the step of energizing the gradient coil is performed with the gradient coil positioned in the vacuum vessel to receive cryogenic cooling thereby rendering the gradient coil in a superconductive state at or near said temperature.

11. A Magnetic Resonance Imaging (MRI) systems with an imaging volume therein, comprising:
    a vacuum vessel positioned about the imaging volume;
    at least one high temperature superconducting coil positioned within the vacuum vessel and configured to pass a magnetic field into the imaging volume;
    a cryocooler coupled to the vacuum vessel to operate the superconducting coil in a superconductive state while at a temperature above 20 K; and
    at least one gradient coil for modulating the magnetic field within the imaging volume, said gradient coil positioned between the imaging volume and the superconducting coil without any thermal shield structure interposed between the gradient coil and the superconducting coil.

12. A method for forming an MRI system comprising the steps of:
    providing a main coil formed of a High Temperature Superconductor material within a cryogenically cooled vessel and configuring the main coil to generate a magnetic field within an imaging volume;

providing a gradient coil for adjusting the magnetic field generated by the main coil, operation of the gradient coil contributing to a thermal load within the vessel; and providing sufficient cooling capacity to the vessel to sustain a desired temperature for energizing the main coil under a thermal load in the absence of a thermal shield structure interposed between the gradient coil and the main coil.

13. The method of claim 12 wherein the step of providing the gradient coil includes positioning the gradient coil within the vessel.

14. A magnetic resonance imaging (MRI) system with an imaging volume therein, comprising;

a cryogenically cooled vessel positioned about the imaging volume;

at least one main coil predominately comprising a High Temperature Superconductor material, said coil configured within the cryogenically cooled vessel for operation in a superconducting state to generate a magnetic field within the imaging volume; and at least one gradient coil for adjusting the generated magnetic field, wherein said gradient coil comprises a High Temperature Superconductor material and is disposed within said vessel together with said main coil and wherein the operating temperature at which the main coil generates the magnetic field enables said main coil and said gradient coil to operate free of a thermal shield structure interposed between them.

15. The system of claim 14 wherein the main coil is a winding formed of $MgB_2$.

16. The system of claim 14 wherein the main coil is a winding capable of sustaining a critical current density of at least 100 Amps per square cm at a temperature of 20 K.

17. The system of claim 14 further including thermal reservoir material within a portion of the vessel allowing sufficient volume to receive cryogen for heat exchange therein.

* * * * *

UNITED STATES PATENT AND TRADEMARK OFFICE
CERTIFICATE OF CORRECTION

PATENT NO. : 7,319,327 B2  Page 1 of 1
APPLICATION NO. : 11/282074
DATED : January 15, 2008
INVENTOR(S) : Ryan et al.

It is certified that error appears in the above-identified patent and that said Letters Patent is hereby corrected as shown below:

In Column 1, Line 58, delete "me" and insert -- the --, therefor.

In Column 2, Line 11, below "reduced." insert -- SUMMARY OF THE INVENTION --.

In Column 2, Line 62, delete "them" and insert -- there --, therefor.

In Column 3, Line 16, after "50," insert -- to --.

In Column 4, Line 19, delete "these." and insert -- these, --, therefor.

Signed and Sealed this

Thirtieth Day of March, 2010

David J. Kappos
*Director of the United States Patent and Trademark Office*